(12) United States Patent
Niratsuka et al.

(10) Patent No.: US 9,263,988 B1
(45) Date of Patent: Feb. 16, 2016

(54) CRYSTAL OSCILLATION CIRCUIT

(71) Applicant: Cypress Semiconductor Corporation, San Jose, CA (US)

(72) Inventors: Kimitoshi Niratsuka, Kanagawa (JP); Shingo Sakamoto, Kanagawa (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/446,678

(22) Filed: Jul. 30, 2014

(51) Int. Cl.
*H03B 5/32* (2006.01)
*H03B 5/36* (2006.01)

(52) U.S. Cl.
CPC ............... *H03B 5/364* (2013.01); *H03B 5/32* (2013.01); *H03B 5/36* (2013.01)

(58) Field of Classification Search
CPC .................................. H03B 5/36; H03B 5/32
USPC .................................. 331/158, 116 R, 116 FE
See application file for complete search history.

(56) References Cited

U.S. PATENT DOCUMENTS 8,922,288 B2 * 12/2014 Brekelmans et al. ......... 331/158

FOREIGN PATENT DOCUMENTS

JP 3259528 2/2002

* cited by examiner

*Primary Examiner* — Arnold Kinkead

(57) ABSTRACT

A crystal oscillation circuit is provided with a crystal oscillator, an inverter unit coupled in parallel with the crystal oscillator and including a plurality of inverters, a current supply unit that supplies current to at least a first inverter of the plurality of inverters, a signal converter that supplies current to at least a last inverter of the plurality of inverters and outputs a voltage to an external circuit, and a current controller that makes the current supply unit provide current corresponding to a voltage level of the output voltage of the signal converter. The crystal oscillation circuit is capable of reducing power consumption.

11 Claims, 8 Drawing Sheets

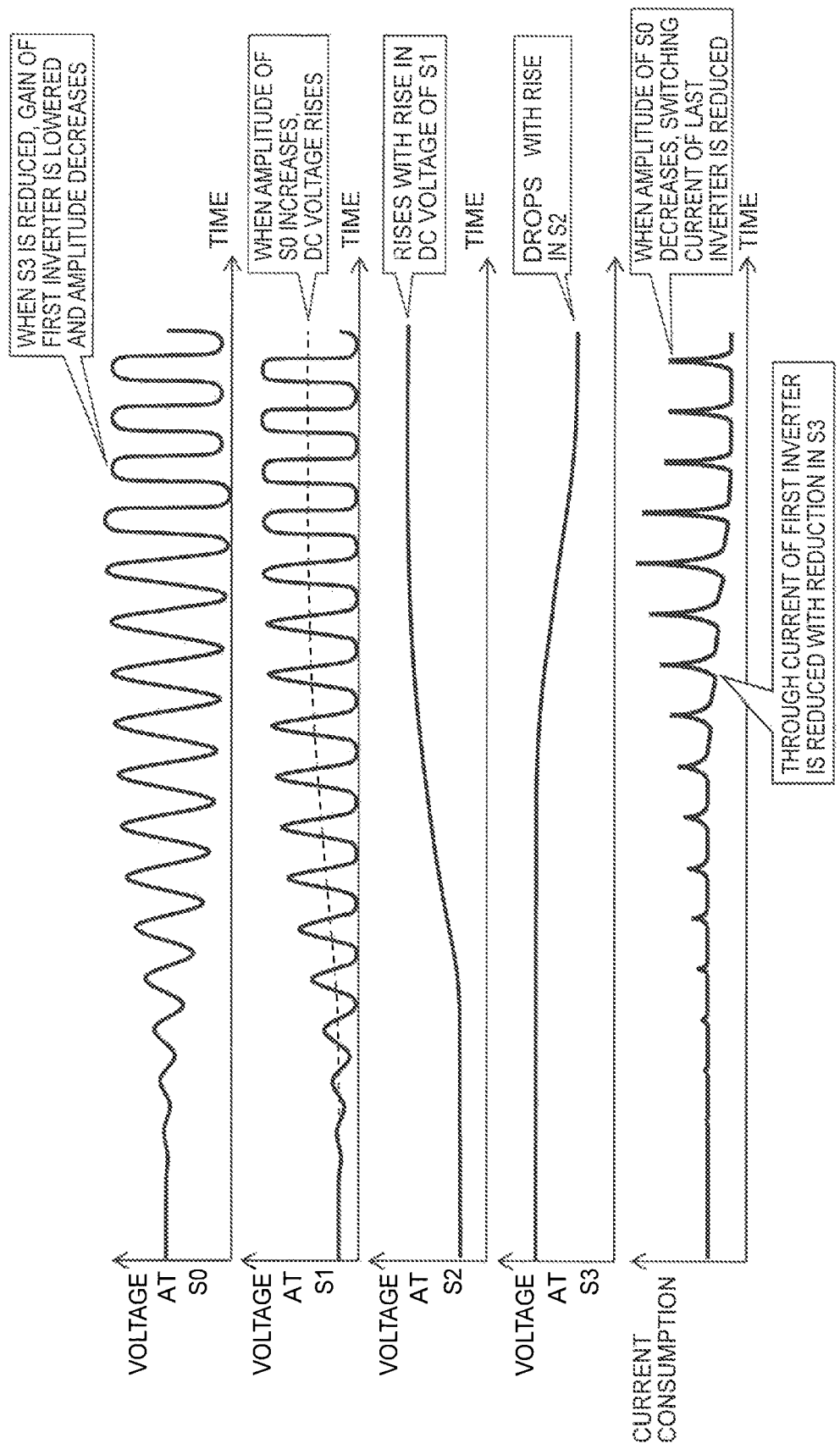

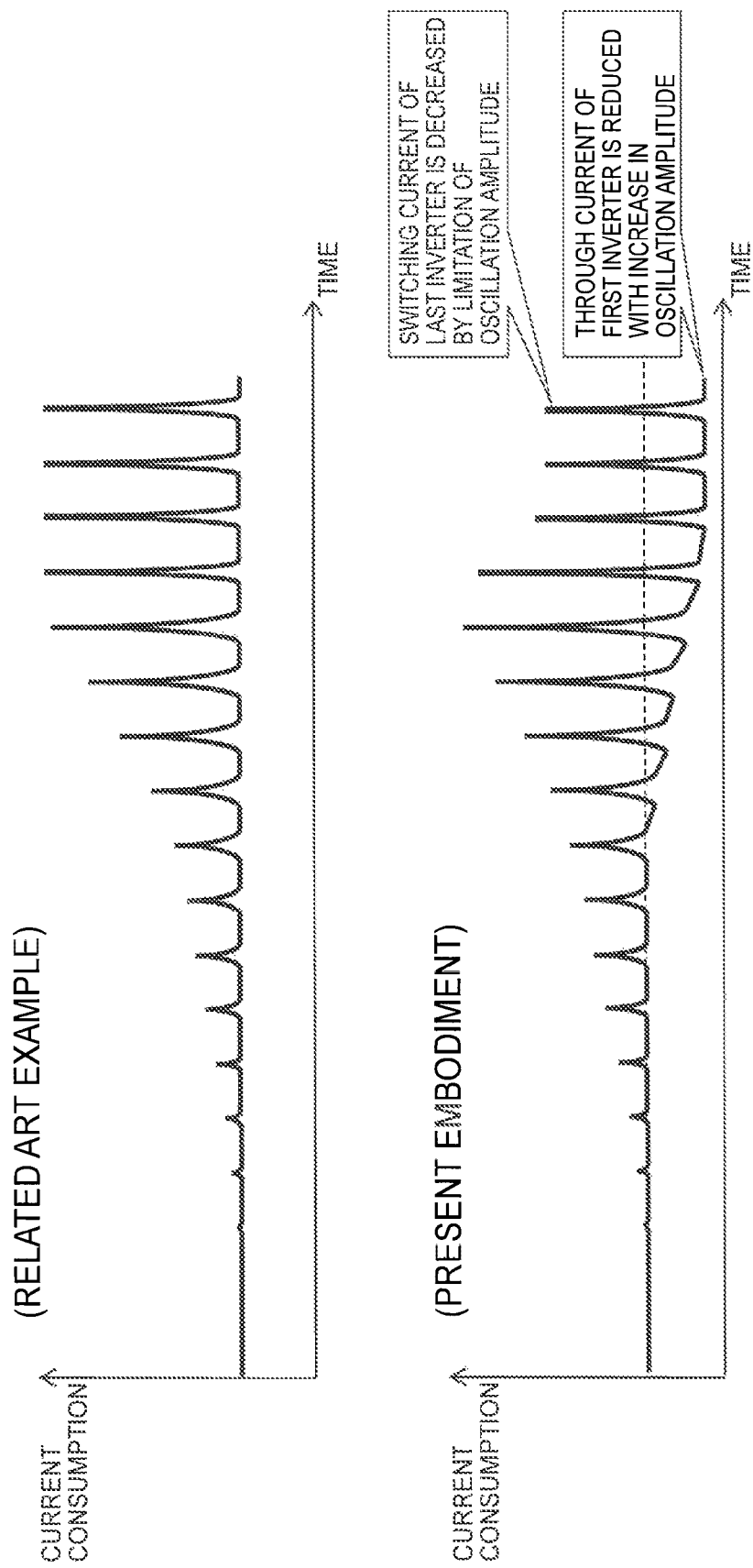

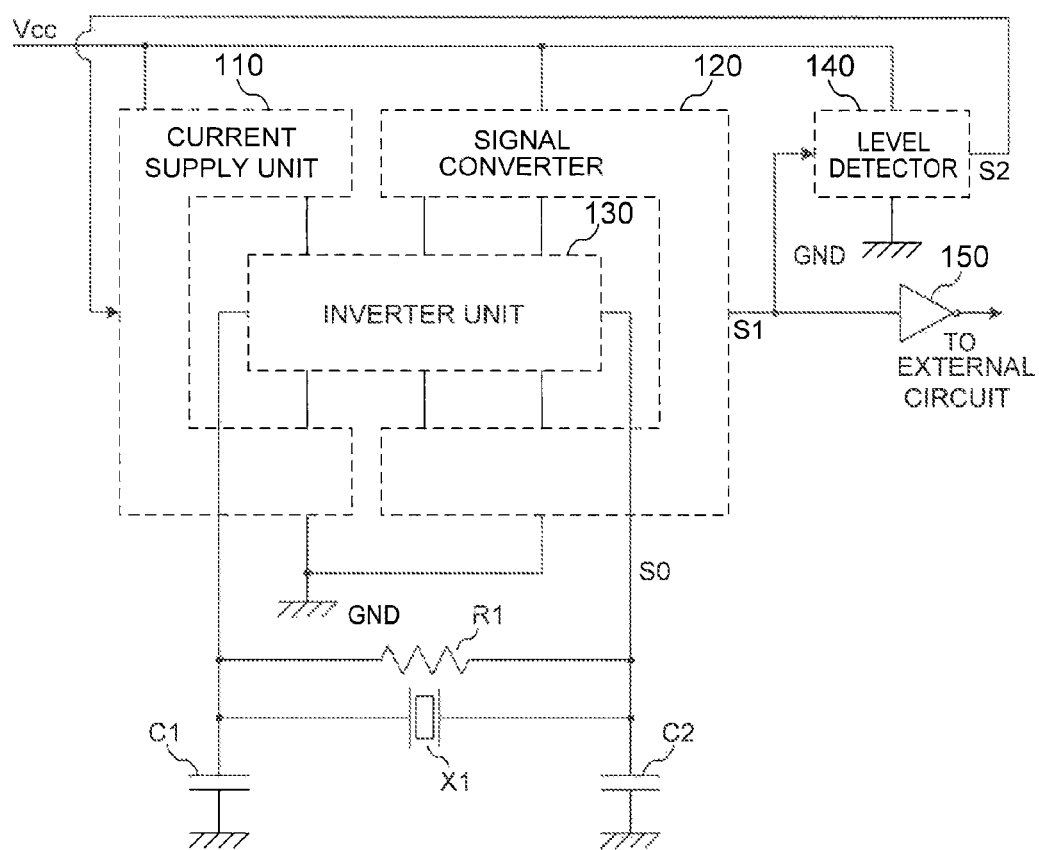

CRYSTAL OSCILLATION CIRCUIT

BACKGROUND

According to an embodiment, a crystal oscillation circuit comprises two capacitors connected between input and output terminals of a crystal oscillator and the ground, and a CMOS inverter coupled in parallel with the crystal oscillator. In such a crystal oscillation circuit, a sine wave is generated by the resonance of the crystal oscillator and the two capacitors. The CMOS inverter amplifies the sine wave and the crystal oscillation circuit outputs a current following the amplified sine wave. A large through current, however, flows through the CMOS inverter.

There are known methods for reducing power consumption due to the through current of such an inverter, such as providing a step-down circuit and a level shifter, as disclosed in, for example, Japanese Patent No. 3259528.

However, such methods are only capable of obtaining a current reducing effect from the voltage drop caused by the step-down circuit. These methods are not capable of controlling the through current of the inverter.

SUMMARY

The present disclosure provides a crystal oscillation circuit capable of reducing power consumption.

A crystal oscillation circuit according to one embodiment is provided with a crystal oscillator, an inverter unit coupled in parallel with the crystal oscillator, a current supply unit, a signal converter, and a level detector. The inverter unit comprises a plurality of inverters. The current supply unit is configured to supply current to at least a first inverter of the plurality of inverters, and the signal converter is configured to supply current to at least a last inverter of the plurality of inverters. The signal converter is also configured to output a voltage to an external circuit. The level detector is configured to output a voltage level equivalent to the amplitude of the voltage outputted by the signal converter. Based on the voltage level, a current controller within the current supply unit is configured to control the current supply unit to adjust the current supplied to at least a first inverter of the plurality of inverters, thus allowing for reduction in the through current of the inverter unit.

BRIEF DESCRIPTION OF THE DRAWINGS

The accompanying drawings are incorporated herein and form a part of the specification.

FIG. 5 is a diagram illustrating signal waveforms of the crystal oscillation circuit illustrated in FIG. 1.

FIG. 6 is a diagram comparing the current consumption in the crystal oscillation circuit illustrated in FIG. 1 and the current consumption in a conventional crystal oscillation circuit.

FIG. 7 is a diagram illustrating a configuration example of a crystal oscillation circuit according to an example embodiment.

DETAILED DESCRIPTION

The present embodiment provides a crystal oscillation circuit including a crystal oscillator and is capable of reducing a through current of an inverter unit, based on a sine wave generated by the crystal oscillator. Incidentally, a method of realizing the crystal oscillation circuit is not limited to the following embodiments, but can be carried out in other various forms within the scope not departing from the gist of the present disclosure. The present embodiment is to be considered in all respects as illustrative and not restrictive as to specific configurations, size and the like.

1. Circuit Configuration 1.1 Outline of Circuit Configuration

Figure 1:
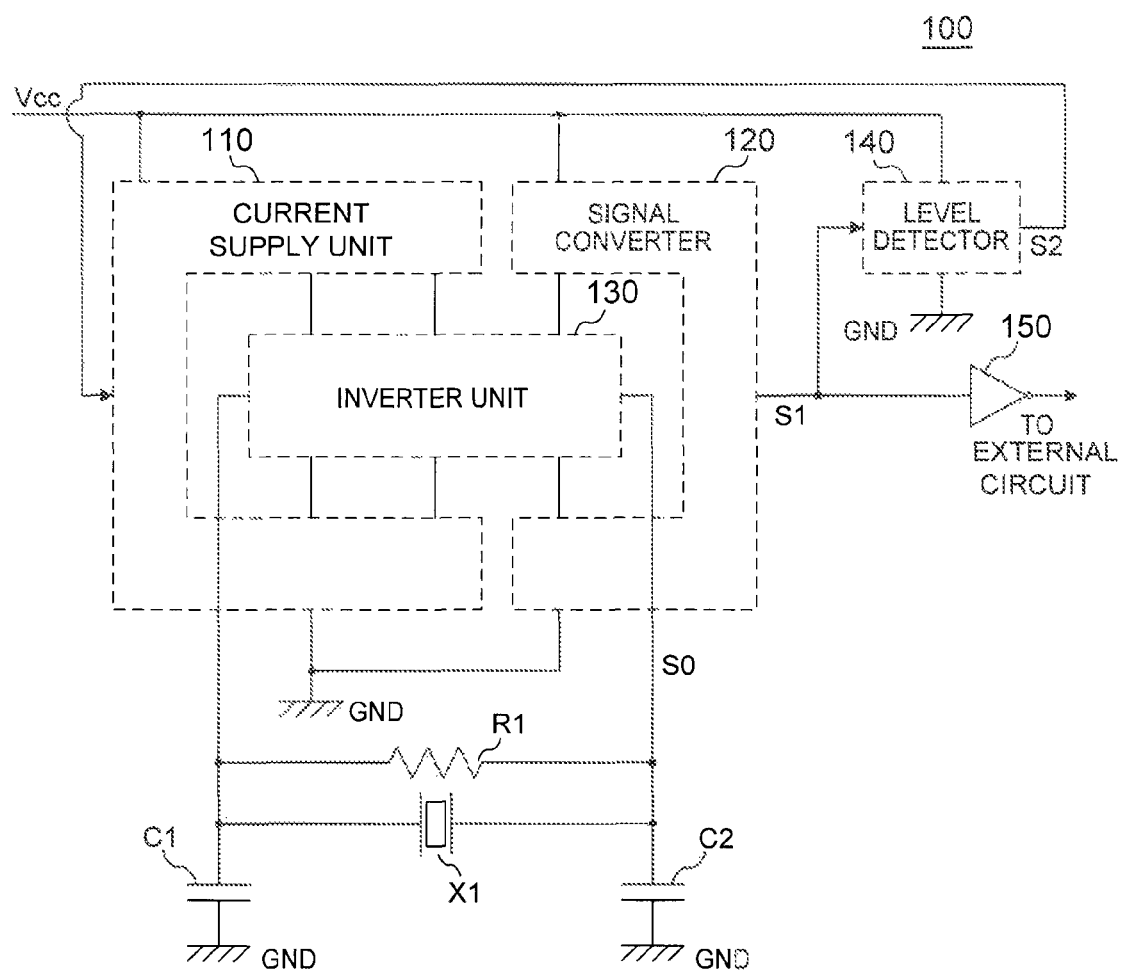
FIG. 1 is a diagram illustrating a configuration example of a crystal oscillation circuit according to an example embodiment.

FIG. 1 is a diagram illustrating a configuration example of a crystal oscillation circuit according to the present embodiment. The crystal oscillation circuit 100 includes a current supply unit 110, a signal converter 120, an inverter unit 130, a level detector 140, and a CMOS inverter 150. A configuration example of the current supply 110, the signal converter 120, the inverter unit 130 and the level detector 140 will be described later while referring to FIG. 2 through FIG. 4B. Also, in the crystal oscillation circuit 100, Vcc indicates a power supply voltage, GND indicates a ground potential, X1 indicates a crystal oscillator, R1 indicates a resistive element, and C1 and C2 indicate capacitors respectively.

The crystal oscillator X1 is coupled in parallel with the resistive element R1 for stable oscillation operation. Input and output terminals of the parallel combination of crystal oscillator X1 and resistive element R1 are respectively coupled to one electrode of the capacitors C1 and C2. The other electrodes of the capacitors C1 and C2 are coupled to ground potential GND. Both ends of the crystal oscillator X1 and the resistive element R1 are respectively coupled to input and output terminals of the inverter unit 130, which includes a plurality of inverters. The inverter unit 130 performs amplification and a polarity reversal operation of a sine wave generated by the oscillation resulting from the resonance of the crystal oscillator X1 and the two capacitors C1 and C2. The node to which one of the ends of the crystal oscillator X1, the resistive element R1, the inverter unit 130 and the capacitor C2 are coupled is taken to be S0.

The current supply unit 110 supplies a current to the inverters included in the inverter unit 130 as soon as the power supply voltage Vcc is supplied. At this time, based on the feedback from the level detector 140 of a voltage level equivalent to the amplitude of an output signal of the crystal oscillation circuit 100, the current supply unit 110 supplies a current corresponding to the voltage level to the inverters included in the inverter unit 130. Here, a node coupled to the level detector 140 and the current supply unit 110 is taken to be S2.

While the inverter unit 130 includes an odd number of three or more of inverters, the current supply unit 110 supplies current to the first stage of the inverters, through which a large through current flows, i.e., the inverters closest to the input terminal side of the inverter unit 130. On the other hand, the current supply unit 110 does not supply the current to at least the last stage of the inverters included in the inverter unit 130, i.e., the inverter closest to the output terminal side of the inverter unit 130. In the present embodiment, as will be described later, the inverter unit 130 includes three inverters, and the current supply unit 110 supplies the current to the first and second inverters.

As soon as the power supply voltage Vcc is supplied, the signal converter 120 supplies a current to the inverters included in the inverter unit 130 to thereby generate and output a voltage to an external circuit such as an internal logic through the CMOS inverter 150. Here, a node to which the signal converter 120, the level detector 140 and the CMOS inverter 150 are coupled is taken to be S1.

While the inverter unit 130 includes the plurality of inverters as described above, the signal converter 120 supplies the current to at least the last inverter of the inverters, resulting in a small through current. The signal converter 120 does not supply the current to at least the first inverter of the inverters included in the inverter unit 130.

The level detector 140 detects a direct-current (DC) voltage level of the amplitude of the voltage outputted by the signal converter 120 at the node S1 and outputs a voltage level equivalent or proportional to the DC voltage level to the current supply unit 110 through the node S2.

The CMOS inverter 150 buffers the voltage outputted by the signal converter 120 at the node S1 to the external circuit.

Subsequently, a description will be made about circuit configuration examples of the current supply unit 110, the signal converter 120 and the inverter 130 with reference to FIG. 2.

1.2 Configuration Example of Inverter Unit 130

In the present embodiment, as described above, the inverter unit 130 includes three inverters 131A through 131C. The number of the inverters included in the inverter unit 130 is, however, not limited to three, but may be of three or more, in odd numbers. The inverters 131A through 131C are collectively called the inverter 131 below.

The inverters 131A through 131C are respectively coupled in series. An input terminal of the inverter 131A is coupled to one end of the resistive element R1, one end of the crystal oscillator X1 and one end of the capacitor C1. Further, an output terminal of the inverter 131C is coupled to the other end of the resistive element R1, the other end of the crystal oscillator X1 and one end of the capacitor C2. Each of the first inverter 131A and the second inverter 131B receives an operating current supply from the current supply unit 110, and the last inverter 131O receives an operating current supply from the signal converter 120.

1.3 Configuration Example of Current Supply Unit 110

Figure 2:
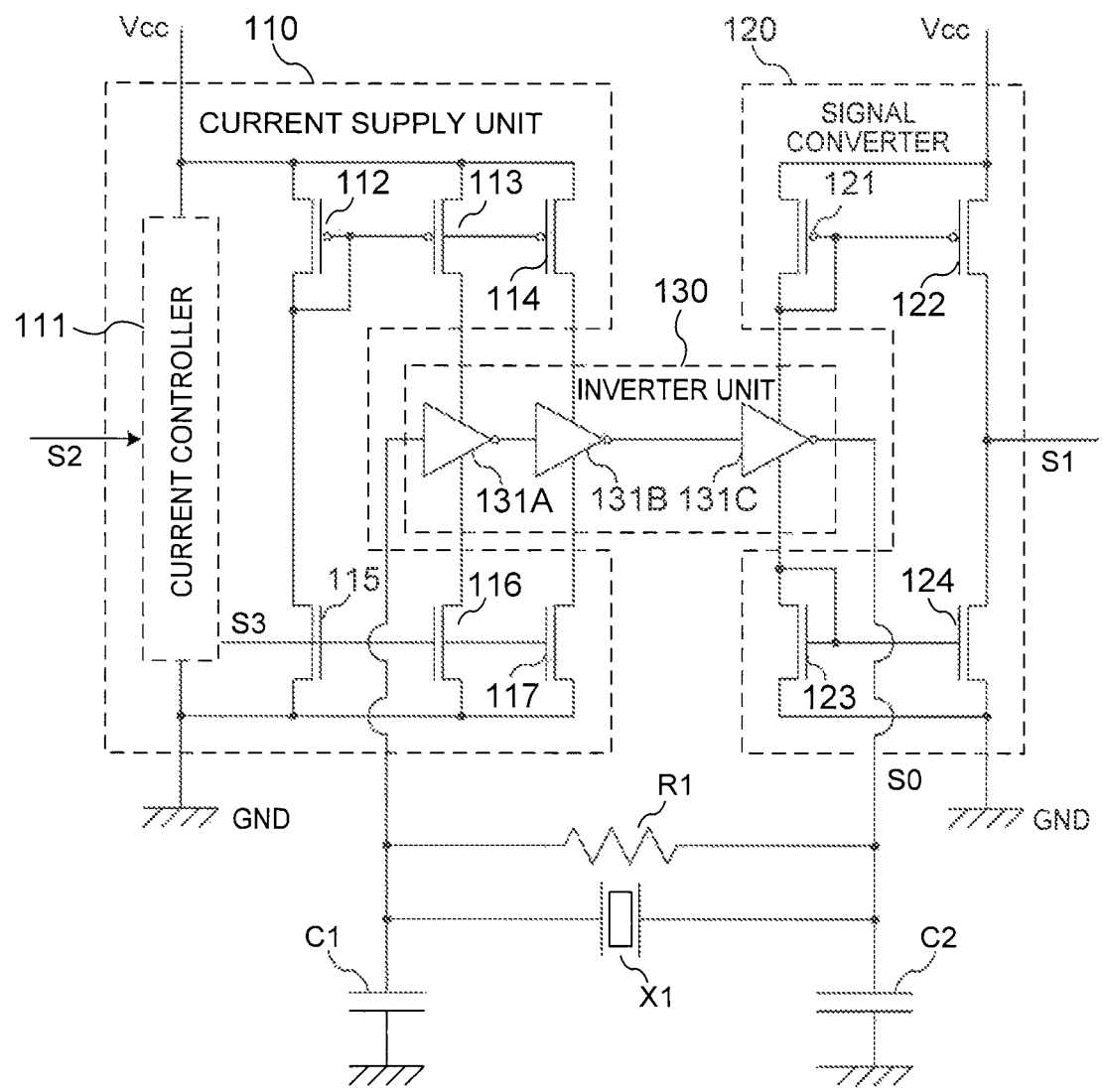
FIG. 2 is a diagram illustrating a section of the crystal oscillation circuit illustrated in FIG. 1.

As shown in FIG. 2, the current supply unit 110 includes a current controller 111. In the configuration of the current supply unit 110 of FIG. 2, elements 112, 113 and 114 denote p-channel metal-oxide-semiconductor (PMOS) transistors. Elements 115, 116 and 117 denote n-channel metal-oxide-semiconductor (NMOS) transistors.

The current controller 111 receives power supply from the power supply voltage Vcc. Further, the current controller 111 receives as input the voltage outputted from the level detector 140 at the node S2, and outputs a voltage corresponding to the voltage at the node S2 to gates of the NMOS transistors 115, 116 and 117. Thus, the current controller 111 is capable of controlling the current supply unit 110 to supply a current corresponding to the level of the voltage of the node S2 to the inverters 131A and 131B. Here, a node to which the current controller 111 and the NMOS transistors 115, 116 and 117 are coupled is taken to be S3. A configuration example of the current controller 111 will be described later with reference to FIG. 3.

The PMOS transistors 112, 113 and 114 have sources coupled to each other and to the power supply voltage Vcc.

Further, the NMOS transistors 115, 116 and 117 have sources coupled to each other and grounded together with the current controller 111.

A drain of the PMOS transistor 112 is coupled to a gate of the PMOS transistor 112 and a drain of the NMOS transistor 115. Drains of the PMOS transistors 113 and 114 are respectively coupled to the inverters 131A and 131B. Drains of the NMOS transistors 116 and 117 are respectively coupled to the inverters 131A and 131B. Thus, current is supplied to the inverters 131A and 131B.

1.4 Configuration Example of Signal Converter 120

In the configuration of the signal converter 120 of FIG. 2, elements 121 and 122 denote PMOS transistors, and elements 123 and 124 denote NMOS transistors.

The PMOS transistors 121 and 122 have sources coupled to each other and to the power supply voltage Vcc. The NMOS transistors 123 and 124 have sources coupled to each other and to the ground potential GND.

Gates of the PMOS transistor 121 and the NMOS transistor 123 are coupled to the inverter 131C, supplying current to the inverter 131C.

Further, the gate and drain of the PMOS transistor 121 and a gate of the PMOS transistor 122 are coupled to each other. The gate and drain of the NMOS transistor 123 and a gate of the NMOS transistor 124 are also coupled to each other. Drains of the PMOS transistor 122 and the NMOS transistor 124 are coupled to each other, at the node S1.

Subsequently, a description will be made about a specific circuit configuration example of the level detector 140 and the current controller 111 with reference to FIG. 3.

1.5 Configuration Example of Level Detector 140

Figure 3:
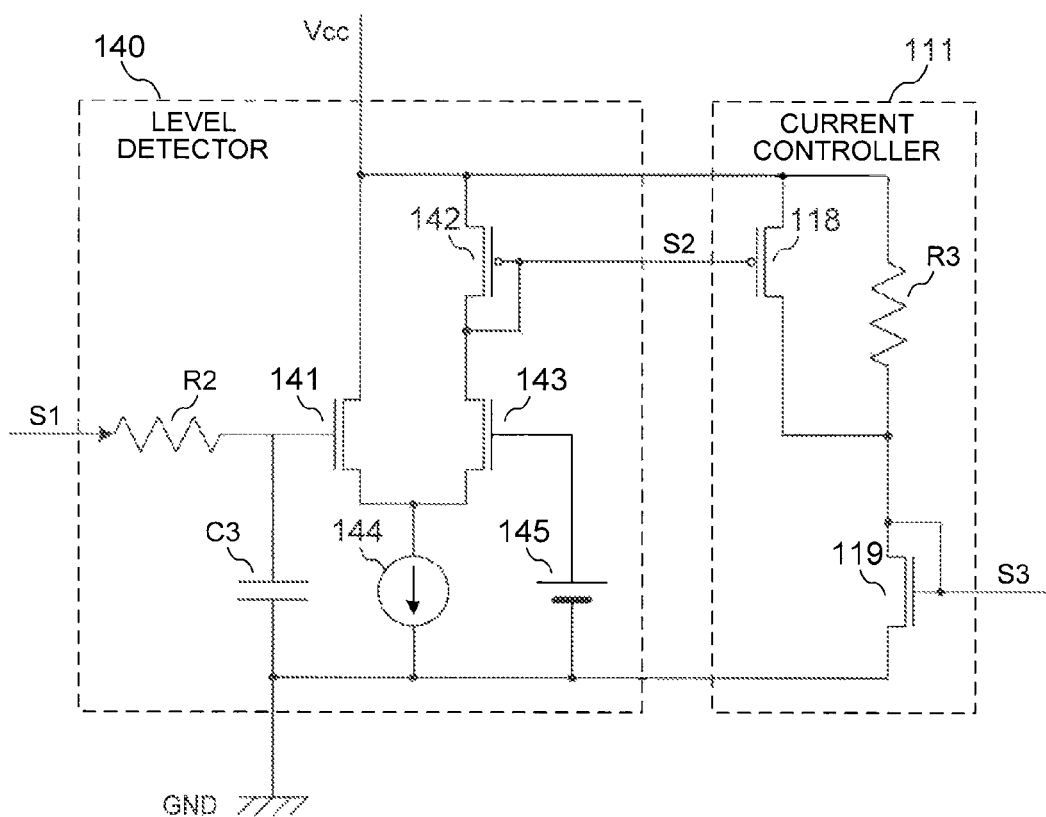
FIG. 3 is a diagram illustrating a section of the crystal oscillation circuit illustrated in FIG. 1.

In the configuration of the level detector 140 of FIG. 3, R2 indicates a resistive element, C3 indicates a capacitor, elements 141 and 143 denote NMOS transistors, element 142 denotes a PMOS transistor, element 144 denotes a constant current source, and element 145 denotes a constant voltage source.

The voltage at the node S1 outputted from the signal converter 120 is inputted to one end of the resistive element R2. The other end of the resistive element R2 is coupled to one electrode of the capacitor C3 and a gate of the NMOS transistor 141. The other electrode of the capacitor C3 is grounded.

A drain of the NMOS transistor 141 and a source of the PMOS transistor 142 are coupled to the power supply voltage Vcc. Further, drains of the PMOS transistor 142 and the NMOS transistor 143 and a gate of the PMOS transistor 142 are coupled to each other at the node S2. The voltage of at the node 32 is outputted to the current controller 111. A gate of the NMOS transistor 143 is coupled to a positive electrode of the constant voltage source 145. A negative electrode of the constant voltage source 145 is grounded.

A source of the NMOS transistor 141 and a source of the NMOS transistor 143 are coupled to each other and to the constant current source 144. The constant current source 144 allows a constant current to flow in the grounding direction from the NMOS transistors 141 and 143.

1.6 Configuration Example of Current Controller 111

In the configuration of the current controller 111 of FIG. 3, R3 indicates a resistive element, element 118 denotes a PMOS transistor, and element 119 indicates an NMOS transistor.

A source of the PMOS transistor 118 is coupled to one end of the resistive element R3 and to the power supply voltage Vcc. A gate of the PMOS transistor 118 receives as input the voltage at the node S2 outputted by the level detector 140. A drain of the PMOS transistor 118 is coupled to the other end of the resistive element R3 and to a drain and a gate of the NMOS transistor 119. A source of the NMOS transistor 119 is grounded.

A description will hereinafter be made about a specific configuration example of the inverter 131 included in the inverter unit 130 with reference to FIGS. 4A and 4B.

1.7 Specific Example of Inverter

Figure 4A:
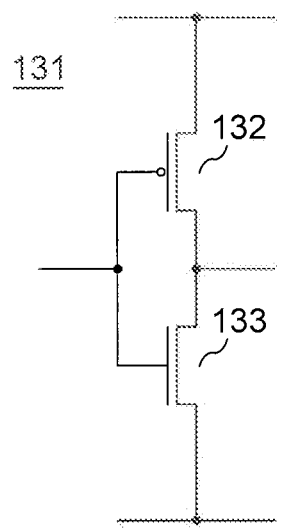
FIGS. 4A-4B are diagrams illustrating configuration examples of an inverter.
Figure 4B:
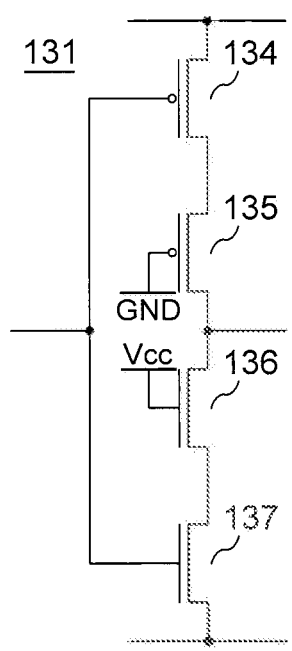

FIGS. 4A and 4B are diagrams illustrating the specific configuration example of the inverter 131. The inverter 131 may be either of the configurations illustrated in FIGS. 4A and 4B. It should be appreciated that the inverter 131 can adopt other configurations.

The configuration example of the inverter 131 of FIG. 4A is one which comprises a PMOS transistor 132 and an NMOS transistor 133. An input terminal of the inverter 131 is coupled to gates of the PMOS transistor 132 and the NMOS transistor 133. Further, drains of the PMOS transistor 132 and the NMOS transistor 133 are coupled to each other and to an output terminal of the inverter 131. Sources of the PMOS transistor 132 and the NMOS transistor 133 are respectively supplied with an operating current.

The configuration example of the inverter 131 of FIG. 4B is one which comprises PMOS transistors 134 and 135, and NMOS transistors 136 and 137. An input terminal of the inverter 131 is coupled to gates of the PMOS transistor 134 and the NMOS transistor 137. A drain of the PMOS transistor 134 is coupled to a source of the PMOS transistor 135, and a drain of the NMOS transistor 137 is coupled to a source of the NMOS transistor 136, respectively. Drains of the PMOS transistor 135 and the NMOS transistor 136 are coupled to each other and to an output terminal of the inverter 131. Sources of the PMOS transistor 134 and the NMOS transistor 137 are respectively supplied with an operating current. By this configuration, the inverter 131 performs amplification and polarity reversal of the input current.

2. Example of Signal Waveforms

FIG. 5 is a diagram illustrating signal waveforms in the crystal oscillation circuit 100 according to the present embodiment. More specifically, FIG. 5 illustrates, on the same time axis as seen from the starting time point (point at which the crystal oscillation circuit 100 is started) when the power supply voltage Vcc is supplied, the voltages at the nodes S0, S1, S2 and S3, and the current consumption by the crystal oscillation circuit 100 from the power supply voltage Vcc.

Immediately after the starting of the crystal oscillation circuit 100, when the signal amplitude of the voltage at the node S0 is small, the DC voltage at the node S1 is equal to or less than the threshold value of the level detector 140 and the level of the voltage at the node S2 is low. Therefore, the voltage at the node S3 outputted from the current controller 111 is high. That is, a large current is supplied from the current controller 111 to the inverters 131A and 131B.

The signal amplitude of the voltage at the node S0 is almost zero when the crystal oscillation circuit starts up, but gradually becomes large with the lapse of time. Likewise, the signal amplitude of the node S1 outputted from the signal converter 120 becomes large. The DC voltage of the voltage at the node S1 increases with an increase in the signal amplitude of the node S0. With the rise in the DC voltage at the node S1, the voltage at the node S2 outputted from the level detector 140 also rises.

With the rise in the voltage at the node S2, the voltage of the node S3 outputted from the current controller 111 is gradually reduced. Consequently, the current supplied to the first and second inverters 131A and 131B decreases. As a result, the gains of the inverters 131A and 131B are lowered and the signal amplitude of the voltage at node S0 decreases.

Considering current consumption of the whole crystal oscillation circuit 100, the switching current in the inverter unit 130 and the peak value of the current gradually becomes large with the increase in the signal amplitude of the voltage at node S0. However, with the reduction in the voltage at the node S3, the through current in the inverters 131A and 131B is gradually reduced. Further, since the switching current in the last inverter 131C is reduced, i.e., the switching current flowing through the signal converter 120 is reduced, when the signal amplitude of the node S0 decreases, the peak value of the current consumption also decreases.

The comparison of current consumption in the conventional crystal oscillation circuit and current consumption in the crystal oscillation circuit 100 according to the present embodiment is shown in FIG. 6. In the present embodiment, the through current in the first inverter 131A is reduced with the increase in the signal amplitude of the voltage at the node S0 by the current control of the current controller 111 which receives the feedback voltage from the level detector 140. Further, the switching current in the last inverter 131C is reduced by limiting the signal amplitude of the node S0. Consequently, the current consumption is substantially reduced compared with the current consumption in the conventional typical crystal oscillation circuit shown in FIG. 6.

3. Modifications

Figure 8:
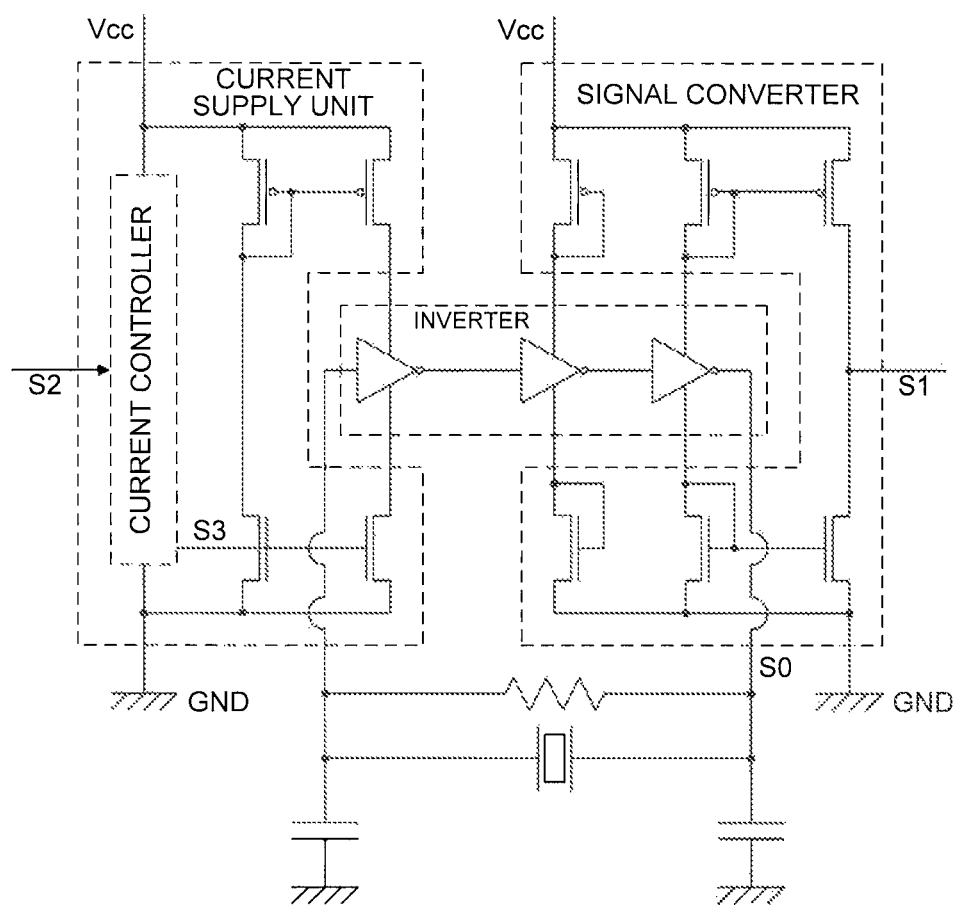
FIG. 8 is a diagram illustrating a section of the crystal oscillation circuit illustrated in FIG. 7.

In the above-described embodiment, the first and second inverters 131A and 131B of the inverter unit 130 have been coupled to the current controller 110, and the last inverter 131C has been coupled to the signal converter 120. The present embodiment is however not limited to such a configuration. As illustrated in FIG. 7 and FIG. 8, by way of example, only the first inverter 131A may be supplied with the current from the current supply unit 110, and the second and last inverters 131B and 131C may be supplied with the current from the signal converter 120. Although a detailed description the modified circuit configuration as illustrated in FIG. 8 is omitted herein, the outline of a signal waveform and an operative effect obtained is similar to the above embodiment.

Incidentally, the configurations of the above-described embodiments may be combined or some components may be replaced. Further, the configuration of the present disclosure is not limited only to the above-described embodiments, but may be modified in various ways within the scope not departing from the gist of the present disclosure.

What is claimed is:
1. A crystal oscillation circuit, comprising:
a crystal oscillator;
an inverter unit coupled in parallel with the crystal oscillator, the inverter unit comprising a plurality of inverters,
a current supply unit configured to supply a first current to at least a first inverter of the plurality of inverters;
a signal converter configured to supply a second current to at least a last inverter of the plurality of inverters and output an output voltage to an external circuit; and
a current controller configured to control the first current according to a voltage level of the output voltage,
wherein the plurality of inverters comprises an odd number of three or more of inverters.
2. The crystal oscillation circuit of claim 1, wherein the current controller lowers the first current in accordance with an increase in the voltage level.

3. The crystal oscillation circuit of claim 1, further comprising a level detector configured to generate the voltage level proportional to a signal amplitude of the output voltage.

4. The crystal oscillation circuit of claim 1, wherein the first inverter of the plurality of inverters has a fan-out of 1.

5. The crystal oscillation circuit of claim 1, wherein the last inverter of the plurality of inverters has a fan-in of 1.

6. The crystal oscillation circuit of claim 1, wherein an input terminal of the first inverter of the plurality of inverters is coupled to a first end of a resistive element, a first end of the crystal oscillator, and an end of a first capacitor and wherein an output terminal of the last inverter of the plurality of inverters is coupled to a second end of the resistive element, a second end of the crystal oscillator, and an end of a second capacitor.

7. The crystal oscillation circuit of claim 1, further comprising a level detector, wherein the output of the signal converter is coupled to the level detector.

8. The crystal oscillation circuit of claim 7, wherein the output of the signal converter is coupled to an input of an inverter, and wherein an output of the inverter is connected to the external circuit.

9. A crystal oscillation circuit, comprising:
   a crystal oscillator;
   an inverter unit coupled in parallel with the crystal oscillator, the inverter unit comprising a plurality of inverters connected in series,
   a current supply unit configured to supply a first current to at least a first inverter of the plurality of inverters;
   a signal converter configured to supply a second current to at least a last inverter of the plurality of inverters and output an output voltage to an external circuit; and
   a current controller configured to control the first current according to a voltage level of the output voltage.

10. The crystal oscillation circuit of claim 9, wherein the plurality of inverters comprises a first inverter, a second inverter, and a third inverter, wherein the current supply unit is configured to supply the first current to the first and second inverters, and wherein the signal converter is configured to supply the second current to the third inverter.

11. An integrated circuit comprising:
   an external circuit; and
   a crystal oscillation circuit comprising:
      a crystal oscillator;
      an inverter unit coupled in parallel with the crystal oscillator, the inverter unit comprising a plurality of inverters;
      a current supply unit configured to supply a first current to at least a first inverter of the plurality of inverters;
      a signal converter configured to supply a second current to at least a last inverter of the plurality of inverters and output an output voltage to the external circuit; and
      a current controller configured to control the first current according to a voltage level of the output voltage, wherein the plurality of inverters comprises an odd number of three or more of inverters.

* * * * *